US012809336B2

(12) United States Patent
Nandan et al.

(10) Patent No.: US 12,809,336 B2
(45) Date of Patent: Nov. 24, 2026

(54) SUBSTRATE PROCESS OPERATION ANALYSIS APPLICATION AND GENERATION OF VISUALIZATIONS

(71) Applicant: Applied Materials, Inc., Santa Clara, CA (US)

(72) Inventors: Rituraj Nandan, Milpitas, CA (US); Ramachandran Subramanian, Chennai (IN); Brett Robert Schroeder, Portland, OR (US); Pardeep Kumar, Greater Noida (IN); Zhenxing Han, Sunnyvale, CA (US); Martha Inez Sanchez, Menlo Park, CA (US); Bharath Ram Sundar, Chennai (IN); Madhur Singh Sachan, Belmont, CA (US); Sundar Narayanan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 465 days.

(21) Appl. No.: 18/213,790

(22) Filed: Jun. 23, 2023

(65) Prior Publication Data

US 2024/0427308 A1 Dec. 26, 2024

(51) Int. Cl.
*G05B 19/4099* (2006.01)
*G03F 7/00* (2006.01)
*G05B 13/00* (2006.01)

(52) U.S. Cl.
CPC ...... *G05B 19/4099* (2013.01); *G03F 7/70441* (2013.01); *G03F 7/705* (2013.01);
(Continued)

(58) Field of Classification Search
CPC .. G03F 7/705; G03F 7/70633; G03F 7/70681; G03F 7/70441; H01L 22/12;
(Continued)

(56) References Cited

U.S. PATENT DOCUMENTS 7,382,447 B2 * 6/2008 Mieher ............... G03F 7/70625 430/30
8,154,710 B2 * 4/2012 Mimotogi ............... G03F 7/705 355/77
(Continued)

FOREIGN PATENT DOCUMENTS

KR 101215367 B1 12/2012
WO 2022230788 A1 11/2022

OTHER PUBLICATIONS

International Search Report and Written Opinion for International Application No. PCT/US2024/034828, mailed Oct. 10, 2024, 09 pages.

*Primary Examiner* — Ronald D Hartman, Jr.
(74) *Attorney, Agent, or Firm* — Lowenstein Sandler LLP

(57) ABSTRACT

A method includes receiving data indicative of a range of processing conditions associated with a plurality of substrate processing operations. The data indicative of the range of processing conditions includes a first range of values of a first property and a second range of values of a second property of the processing conditions. The method further includes receiving data indicative of processing performance associated with the plurality of processed substrates. The data includes a first set of data associated with a first indication of substrate performance and a second set of data associated with a second indication of substrate performance. The method further includes performing analysis relating the processing conditions to the processing performance. The method further includes generating a visualization presenting results of the analysis including representations of the first indication of substrate performance and the second indication of substrate performance.

20 Claims, 6 Drawing Sheets

(52) U.S. Cl.
CPC ...... *G03F 7/70633* (2013.01); *G03F 7/70681* (2023.05); *G05B 13/00* (2013.01); *G05B 2219/45031* (2013.01)

(58) Field of Classification Search
CPC ..... H01L 22/20; G05B 13/00; G05B 19/4099; G05B 2219/45031
USPC .......................................................... 700/121
See application file for complete search history.

(56) References Cited

U.S. PATENT DOCUMENTS

| | | | | |
|---|---|---|---|---|
| 8,893,067 | B2 * | 11/2014 | Ye | G03F 7/705 700/121 |
| 9,946,165 | B2 | 4/2018 | Ypma et al. | |
| 10,896,282 | B2 | 1/2021 | Pandey et al. | |
| 2009/0157360 | A1 * | 6/2009 | Ye | G03F 7/70991 703/2 |
| 2010/0211903 | A1 * | 8/2010 | Luque | H01L 22/20 715/771 |
| 2014/0257761 | A1 * | 9/2014 | Zhou | G03F 7/70641 703/1 |
| 2015/0268560 | A1 | 9/2015 | Tada et al. | |
| 2017/0160648 | A1 * | 6/2017 | Tel | G03F 7/70516 |
| 2019/0064755 | A1 | 2/2019 | Ohmori et al. | |
| 2019/0384182 | A1 | 12/2019 | Takarada et al. | |
| 2021/0018850 | A1 * | 1/2021 | Slachter | G03F 7/70558 |

* cited by examiner

SUBSTRATE PROCESS OPERATION ANALYSIS APPLICATION AND GENERATION OF VISUALIZATIONS

TECHNICAL FIELD

The instant specification relates to an analysis application for substrate process procedures. Specifically, the specification relates to an analysis application and generation of visualizations for substrate process operations.

BACKGROUND

Chambers are used in many types of processing systems. Examples of chambers include etch chambers, deposition chambers, anneal chambers, and the like. Typically, a substrate, such as a semiconductor wafer, is placed on a substrate support within the chamber and conditions in the chamber are set and maintained to process the substrate. Often, models are utilized to improve processing procedures. Models may be utilized in generating indications of correlations between process condition space and substrate property space.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect, a method includes receiving data indicative of a range of processing conditions associated with a plurality of substrate processing operations. The data indicative of the range of processing conditions includes a first range of values of a first property and a second range of values of a second property of the processing conditions. The method further includes receiving data indicative of processing performance associated with the plurality of processed substrates. The data includes a first set of data associated with a first indication of substrate performance and a second set of data associated with a second indication of substrate performance. The method further includes performing analysis relating the processing conditions to the processing performance. The method further includes generating a visualization presenting results of the analysis including representations of the first indication of substrate performance and the second indication of substrate performance.

In another aspect, a non-transitory machine-readable storage medium stores instructions which, when executed, cause a processing device, via an application executed by the processing device, to perform operations including receiving data indicative of a range of processing conditions associated with a plurality of substrate processing operations. The data indicative of the range of processing conditions includes a first range of values of a first property and a second range of values of a second property of the processing conditions. The operations further include receiving, by the application executed by the processing device, data indicative of processing performance associated with the plurality of processed substrates. The data indicative of processing performance includes a first set of data associated with a first indication of substrate performance and a second set of data associated with a second indication of substrate performance. The operations further include performing analysis relating the processing conditions to the processing performance. The operations further include generating, for display on a client device, a visualization presenting results of the analysis. The visualization includes representations of the first indication of substrate performance and the second indication of substrate performance.

In another aspect, a system includes memory and a processing device coupled to the memory. The processing device is to execute an application. Executing the application includes receiving data indicative of a range of processing conditions associated with a plurality of substrate processing operations. The data indicative of the range of processing conditions comprises a first range of values of a first property and a second range of values of a second property of the processing conditions. Executing the application further includes receiving data indicative of processing performance associated with the plurality of processed substrates. The data indicative of processing performance includes a first set of data associated with a first indication of substrate performance and a second set of data associated with a second indication of substrate performance. Executing the application further includes performing analysis relating the processing conditions to the processing performance. Executing the application further includes generating, for display on a client device, a visualization presenting results of the analysis. The visualization includes representations of the first indication of substrate performance and the second indication of substrate performance.

BRIEF DESCRIPTION OF THE DRAWINGS

The present disclosure is illustrated by way of example, and not by way of limitation in the figures of the accompanying drawings.

DETAILED DESCRIPTION

Figure 1:
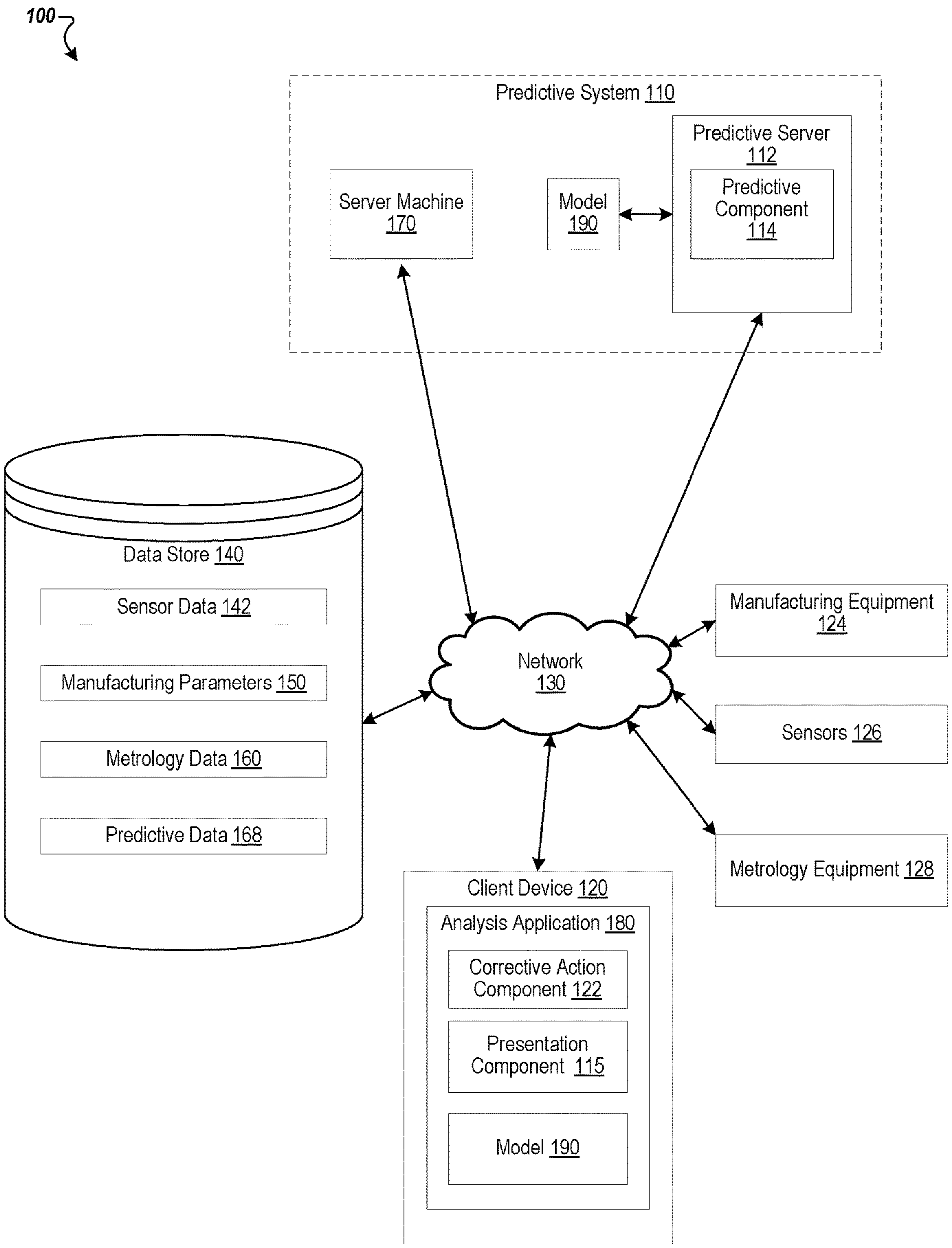
FIG. 1 is a block diagram illustrating an exemplary system (exemplary system architecture), according to some embodiments.

Described herein are technologies, methods, and systems related to analysis tools for increasing analytic power and efficiency in connection with substrate processing operations, such as semiconductor wafer processing procedures. Tools for generating and/or performing recommended corrective actions are provided. Tools for increasing reliability of processing operations are provided. Tools for increased efficiency of designing substrate processing procedures (e.g., process recipes) for target substrate performance outcomes are provided.

Substrate performance targets increasingly present challenges for substrate processing procedures. As substrate-adjacent technologies (e.g., devices including semiconductors) become smaller, more complicated, more efficient, etc., design constraints upon substrates become more stringent. Target properties, defect avoidance, material properties, etc., are becoming ever more difficult to achieve. Increased difficulty may be experienced in any phases of substrate processing, e.g., substrate deposition operations, substrate etch operations, substrate annealing operations, substrate lithography operations, etc., may be of increasing complexity.

Achieving means for meeting substrate performance thresholds may be a resource-intensive process. In some embodiments, target substrate properties are provided. Achieving the target properties may include developing a new process procedure, developing a new substrate material, determining the results of applying known methods to materials typically used in concert with other materials, or the like. Any change in substrate design may include extensive iterative design work, testing, metrology, and analysis.

In some systems, one or more substrates may be processed in designing a new product, process, or the like. Substrates may be processed by a variety of process conditions. For example, many substrates may be subjected to different etch or deposition process conditions. As another example, many different lithography conditions may be utilized in processing. In some cases, many different process conditions (such as different lithography conditions) may be utilized for different portions of a single substrate.

Data analysis may be undertaken to develop understanding of how process conditions affect output substrate properties, output substrate performance, etc. Data analysis may be undertaken to develop understanding of how process conditions related to the type of process engaged in affect substrate properties. For an etch or deposition process, temperature, process gas, plasma properties if applicable, etc., may be monitored and analyzed to determine how the process parameters affect substrate performance. For a lithography process, dose (e.g., total exposure to radiation from the lithography tool) and focus (e.g., location of a focus of the radiation compared to the substrate surface) may be monitored and correlated to substrate performance.

Data analysis may include correlating input (process parameters) to output (substrate performance). Traditional analysis of lithographic data includes Bossung analysis. In Bossung analysis, a $2^{nd}$ order polynomial is fitted relating average line critical dimension (CD) to focus location. A series of fits may be made for different dose values. Further analysis may be performed to ensure other substrate performance properties can be achieved at a focus and dose combination chosen via Bossung analysis.

In some systems, a variety of tools or applications may be utilized in performing analysis of substrate processing procedures. Different applications may be utilized for data processing, fitting, visualization, corrective action recommendations, etc. Parameters for analysis may be chosen by hand, e.g., by a user. Parameters for analysis may not be unified between users, which may lead to delay in determining corrective actions, adjusting a process recipe, etc. Total subject matter expert time devoted to analysis of substrate performance/substrate process parameter data may be very large.

Methods and systems of the present disclosure addresses the above and other shortcoming of conventional methods. In some embodiments, an analysis application may perform many analysis tasks in a useful and consistent way. Analysis may include recommending corrective actions. Analysis may include providing visualizations indicating relationships between process variables and substrate performance. The application may receive input data, perform analysis, present visualizations, recommend corrective actions, provide a user interface (UI) for adjusting analysis and/or visualizations, etc., in a cohesive and comprehensive package.

In some embodiments, an analysis application receives data indicative of substrate processing. The data may include measurements of one or more process conditions. The data may include set points of one or more process conditions. The data may include measured results of process conditions. The data may include data indicative of substrate performance. The data may include properties of a substrate after processing. The data may include properties such as material properties, geometric properties, defect properties, etc.

The analysis application may perform conventional analyses, e.g., for comparison to previously analyzed data sets. The analysis application may perform further analysis. In some embodiments, the analysis application may perform a fit relating two process variables to a substrate performance output. For example, in a lithography analysis, the analysis application may generate a two dimensional surface as a fit relating a process output to dose and focus values. The process output may include CD, line-width roughness, line-edge roughness, defect likelihood, etc.

The analysis application may determine an appropriate range of process conditions, e.g., based on target substrate performance, target substrate processing operation performance, etc. For example, the analysis application may determine one or more regions of process space (e.g., process condition values) that result in acceptable target substrate properties with a target confidence. As another example, the analysis application may determine one or more regions of process space that result in acceptable target substrate properties and acceptable substrate property variation (e.g., slope of the fit surface).

The analysis application may determine one or more ranges of process conditions, e.g., ranges that correlate to some group of output properties. For example, regions of process space may be generated that correlate to various values of an output property.

The analysis application may determine one or more ranges of process conditions that correlate to likelihoods of generating a defect on a substrate. The analysis application may determine one or more regions of process condition space that correlate to likelihoods of a target type of defect.

The analysis application may generate a visualization. A visualization generated by the analysis application may display separations of regions in process space. A visualization generated by the analysis application may display separations of regions of process space related to one, two, or more variables in substrate performance space. For example, a visualization may display regions of process space that generate an acceptable CD with a target confidence, and further display regions of process space that meet a threshold display likelihood condition. A user may be able to visually select process conditions that meet acceptable conditions, e.g., sufficiently large regions of process space that meet target substrate performance metrics, and have a sufficiently low likelihood of developing defects. In some embodiments, the analysis application may highlight regions of process space that satisfy multiple conditions, e.g., regions of process space that overlap between regions associated with multiple target outcomes. In some embodiments, the analysis application may recommend a corrective action. In some embodiments, the analysis application may perform a corrective action.

Aspects of the present disclosure include technical advantages over conventional solutions. The analysis application enables flexible tools for process data analysis. The application enables consistent analysis across a variety of tools, facilities, chambers, users, substrate designs, etc. The analysis application enables visualization of multiple process results. The analysis application enables quick determination of process conditions likely to achieve substrate manufacturing satisfying one or more threshold conditions.

Analysis of substrate processing procedures may be performed from input data (e.g., process sensor data) to finish (e.g., visualizations indicating recommended actions) by the analysis application without intermediate input by users. The analysis application may perform analysis operations subject to a set of analysis parameters, provided to the analysis application. An analysis tool that performs multiple stages of analysis may reduce load of performing analysis on subject matter experts. This may increase an efficiency of analysis, increase efficiency of substrate processing operation design, increase efficacy of process recipe design, etc. An analysis tool that performs multiple stages of analysis may speed up an analysis process, which may enable more agile deployment of corrective actions, reduce waste due do sub-optimal processing conditions, etc.

Consistency in an analysis tool may enable improved process conditions to be employed. Improved process conditions may reduce waste associated with manufacturing and disposing of defective products. Improved process conditions may reduce energy and material expenditure. Improved process conditions may reduce process time, increase process throughput, etc. Improved process conditions may reduce wear and tear, aging, drifting, etc., on components of a processing system. Improved process conditions may reduce frequency of preventative or corrective maintenance, component replacement, etc. Improved process conditions may reduce environmental impact of substrate processing.

Comprehensive analysis may reduce a number of iterative cycles to be performed in generating a process recipe. For example, visualizations that display multiple process outcomes may enable a user to select desirable combinations of process parameters easily, reducing a number of substrates that must be processed to inform decision making in recipe design.

Generating recommended corrective actions by the analysis application may enable quicker improvements to processing operations, such as quicker improvements to recipe design, substrate design, etc. Reducing a time invested in determining corrective actions may save subject matter expert time, energy and materials associated with refining a process operation, energy and materials associated with performing sub-optimal process operations, etc.

In one aspect, a method includes receiving data indicative of a range of processing conditions associated with a plurality of substrate processing operations. The data indicative of the range of processing conditions includes a first range of values of a first property and a second range of values of a second property of the processing conditions. The method further includes receiving data indicative of processing performance associated with the plurality of processed substrates. The data includes a first set of data associated with a first indication of substrate performance and a second set of data associated with a second indication of substrate performance. The method further includes performing analysis relating the processing conditions to the processing performance. The method further includes generating a visualization presenting results of the analysis including representations of the first indication of substrate performance and the second indication of substrate performance.

In another aspect, a non-transitory machine-readable storage medium stores instructions which, when executed, cause a processing device, via an application executed by the processing device, to perform operations including receiving data indicative of a range of processing conditions associated with a plurality of substrate processing operations. The data indicative of the range of processing conditions includes a first range of values of a first property and a second range of values of a second property of the processing conditions. The operations further include receiving, by the application executed by the processing device, data indicative of processing performance associated with the plurality of processed substrates. The data indicative of processing performance includes a first set of data associated with a first indication of substrate performance and a second set of data associated with a second indication of substrate performance. The operations further include performing analysis relating the processing conditions to the processing performance. The operations further include generating, for display on a client device, a visualization presenting results of the analysis. The visualization includes representations of the first indication of substrate performance and the second indication of substrate performance.

In another aspect, a system includes memory and a processing device coupled to the memory. The processing device is to execute an application. Executing the application includes receiving data indicative of a range of processing conditions associated with a plurality of substrate processing operations. The data indicative of the range of processing conditions comprises a first range of values of a first property and a second range of values of a second property of the processing conditions. Executing the application further includes receiving data indicative of processing performance associated with the plurality of processed substrates. The data indicative of processing performance includes a first set of data associated with a first indication of substrate performance and a second set of data associated with a second indication of substrate performance. Executing the application further includes performing analysis relating the processing conditions to the processing performance. Executing the application further includes generating, for display on a client device, a visualization presenting results of the analysis. The visualization includes representations of the first indication of substrate performance and the second indication of substrate performance.

FIG. 1 is a block diagram illustrating an exemplary system 100 (exemplary system architecture), according to some embodiments. The system 100 includes a client device 120, manufacturing equipment 124, sensors 126, metrology equipment 128, a predictive server 112, and data store 140. The predictive server 112 may be part of predictive system 110. Predictive system 110 may further include additional components, such as server machine 170. Client device 120 may include presentation component 115, which may execute operations related to visualizations as described in connection with FIGS. 3, 4, and 5. In some embodiments, presentation component 115 may be included, wholly or in part, in a different component of system 100, such as predictive server 112, server machine 170, or the like.

In some embodiments, manufacturing equipment 124 is part of a substrate processing system (e.g., integrated processing system). The manufacturing equipment 124 includes one or more of a controller, an enclosure system (e.g., substrate carrier, front opening unified pod (FOUP), FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber.

In some embodiments, manufacturing equipment 124 includes components of substrate processing systems. In some embodiments, manufacturing equipment 124 is used to produce one or more products (e.g., substrates, semiconductors, wafers, etc.). In some embodiments, manufacturing equipment 124 is used to produce one or more components to be used in substrate processing systems. In some embodiments, manufacturing equipment 124 may be configured to perform one or more operations associated with semiconductor substrate processing. Manufacturing equipment 124 may be configured to perform substrate film deposition operations. Manufacturing equipment 124 may be configured to perform patterning operations. Manufacturing equipment 124 may be configured to perform lithography operations.

Sensors 126 may provide sensor data 142 associated with manufacturing equipment 124 (e.g., associated with producing, by manufacturing equipment 124, corresponding products, such as wafers). Sensor data 142 may be used for monitoring equipment health and/or product health (e.g., product quality), for example. Manufacturing equipment 124 may produce products following a recipe or performing runs over a period of time. In some embodiments, sensor data 142 may include values of one or more of temperature (e.g., heater temperature), spacing (SP), pressure, High Frequency Radio Frequency (HFRF), voltage of Electrostatic Chuck (ESC), electrical current, flow (e.g., of one or more gases), power, voltage, etc. Sensor data 142 may include measurement of property values over time, e.g., time trace data.

Sensor data 142 may include historical sensor data and current sensor data. Historical sensor data may be related to historical processes, e.g., manufacturing or processing runs associated with previously produced products (e.g., substrates, semiconductor wafers, or the like). Historical sensor data may be sensor data associated with producing one or more test substrates, e.g., for recipe/processing procedure design. Historical sensor data may be utilized as training data for training one or more models, e.g., model 190. Model 190 may be a machine learning model, a physics-based model, a statistical model, and so on. Current sensor data may be associated with an operation that is not historical, e.g., a substrate currently undergoing processing, a substrate that recently underwent processing, a target substrate of interest, or the like. Sensor data 142 may provide an indication of processing conditions to which a substrate is exposed during processing. Sensor data 142 may provide an indication of lithographically relevant conditions, such as a location of a radiation focus, a total dose of radiation provided to a substrate, etc.

Manufacturing equipment 124 may be configured according to manufacturing parameters 150. Manufacturing parameters 150 may be associated with or indicative of parameters such as hardware parameters (e.g., settings or components (e.g., size, type, etc.) of the manufacturing equipment 124) and/or process parameters of the manufacturing equipment. Manufacturing parameters 150 may include historical manufacturing data and/or current manufacturing data. Manufacturing parameters 150 may be indicative of input settings to the manufacturing device (e.g., heater power, gas flow, etc.). Manufacturing parameters 150 may include one or more target property values, and sensor data 142 may include one or more measured property values. Manufacturing parameters 150 may include lithographically relevant parameters, such as target radiation focus location, target radiation delivery dose, etc.

Sensor data 142 and/or manufacturing parameters 150 may be provided while the manufacturing equipment 124 is performing manufacturing processes. Sensor data 142 may be different for each product (e.g., each wafer). Manufacturing parameters 150 may be the same or substantially the same (e.g., excluding metadata or the like) for a family of products (e.g., a product design, a processing recipe, etc.). Historical parameters may be related to historical processes. Historical parameters may be related to manufacturing or processing runs associated with previously produced products. Historical parameters may be utilized as training data for training one or more models, e.g., model 190. Current parameters may be associated with an operation that is not historical, e.g., a substrate currently undergoing processing, a substrate that recently underwent processing, a target substrate of interest, or the like.

Metrology data 160 may include measurements of properties of products produced by manufacturing equipment 124. Metrology data 160 may be indicative of performance of one or more substrates, a quality of performance of manufacturing equipment 124 in producing one or more substrates, etc. Historical sensor data, historical parameters, and metrology data 160 may be associated with produced substrates. Metrology data 160 may include data indicating associations between sets of historical and/or metrology data, e.g., sets of data corresponding to the same produced substrate. Metrology data 160 may include measured and/or predicted metrology (e.g., virtual metrology) associated with any substrate property of interest. Metrology data 160 may include data corresponding to product thickness, resistivity, sheet resistance (e.g., electrical resistivity of a thin film in a direction parallel to a plane of the film), critical dimension (CD, e.g., width of a feature), line width, feature depth, side wall height, or the like. Metrology data 160 may include lithographic metrics, such as line-width roughness, line-edge roughness, etc. Metrology data 160 may include multi-point metrology data, e.g., a feature (such as thickness) may be measured at multiple points of a substrate, e.g., various locations distributed throughout the spatial extent of the substrate. Metrology data 160 may be data associated with one or more test substrates, e.g., substrates used in recipe/process procedure design.

In some embodiments, sensor data 142, metrology data 160, and/or manufacturing parameters 150 may be processed (e.g., by the client device 120 and/or by the predictive server 112). Processing of sensor data 142 may include generating attributes (e.g., data features, vectors, feature vectors, etc.). In some embodiments, the attributes are a pattern in the sensor data 142, metrology data 160, and/or manufacturing parameters 150 (e.g., slope, width, height, peak, etc.) or a combination of values from the sensor data 142, metrology data 160, and/or manufacturing parameters 150 (e.g., power derived from voltage and current, etc.). Sensor data 142 may include attributes and the attributes may be used by predictive component 114 for performing signal processing and/or for obtaining predictive data 168, possibly for performance of a corrective action. Predictive data 168 may be any data associated with predictive system 110, e.g. predicted metrology data of a substrate, predicted properties of a substrate, predicted performance of a substrate or of manufacturing equipment 124, or the like.

Each instance (e.g., set) of sensor data 142 may correspond to a product (e.g., a wafer), a test substrate, a set of test substrates, a set of manufacturing equipment, a type of substrate produced by manufacturing equipment, a combination thereof, or the like. Each instance of metrology data 160 and manufacturing parameters 150 may likewise correspond to a product, one or more test substrates, a set of manufacturing equipment, a type of substrate produced by manufacturing equipment, a combination thereof, or the like. The data store may further store information associating sets of different data types, e.g. information indicative that a set of sensor data, a set of metrology data, and/or a set of manufacturing data are all associated with the same product, manufacturing equipment, type of substrate, etc.

In some embodiments, predictive system 110 may generate predictive data 168 using statistical modeling. For example, predictive system 110 (e.g., via model 190) may perform one or more fits of input data, may perform logistic regression to determine decision boundaries based on input data, etc. In some embodiments, predictive system 110 may generate predictive data 168 using machine learning (e.g., target output comprising data indicative of a manufacturing fault provided in predictive system 110, etc.). In some embodiments, predictive system 110 may generate predictive data 168 using physics-based modeling. Two or more of these techniques may also be combined. Operations of predictive system 110 are discussed in greater detail in connection with FIGS. 2 and 5.

Client device 120, manufacturing equipment 124, sensors 126, metrology equipment 128, predictive server 112, data store 140, and server machine 170 may be coupled to each other via a network 130 for generating predictive data 168. Predictive data 168 may be used in performing corrective actions. Predictive data 168 may be used in displaying model learning and/or relationships between inputs (e.g., manufacturing parameters) and outputs (e.g., substrate properties, processing chamber performance, etc.). Predictive data 168 may be used in presenting multiple substrate performance metrics based on substrate processing conditions.

In some embodiments, network 130 is a public network that provides client device 120 with access to predictive server 112, data store 140, and/or other publicly available computing devices. In some embodiments, network 130 is a private network that provides client device 120 access to manufacturing equipment 124, sensors 126, metrology equipment 128, data store 140, and/or other privately available computing devices. Network 130 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), personal area networks, routers, hubs, switches, server computers, cloud computing networks, and/or a combination thereof.

Client device 120 may include one or more computing devices such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. Client device 120 includes and/or executes an analysis application 180. Analysis application 180 may be utilized by client device 120 in performing methods associated with generating actionable insight for substrate processing procedures. Client device 120 may utilize analysis application 180 to execute operations associated with corrective action component 122, presentation component 115, and/or model 190. In some embodiments, one or more operations depicted as associated with analysis application 180 may be performed outside a cohesive program or application. In some embodiments, one or more operations ascribed to analysis application 180 may be performed by a different device than client device 120, e.g., model 190 may be executed by components of predictive system 110.

Client device 120 may include a corrective action component 122. Corrective action component 122 may be included in analysis application 180 of client device 120. Corrective action component 122 may receive user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data 168) from predictive system 110, determines a corrective action based on the output, and causes the corrective action to be implemented. In some embodiments, presentation component 115 of client device 120 may perform one or more actions associated with providing information to a user. Presentation component 115 may provide one or more plots related to processing input and substrate properties. Presentation component 115 may provide plots for presentation of two substrate performance metrics as functions of two process parameter inputs. For example, presentation component 115 may provide, as a function of lithographic dose and focus, information related to two substrate performance metrics, such as a line roughness measurement and a measurement of a likelihood of developing a substrate defect in processing.

In some embodiments, predictive system 110 may further include a predictive component 114. Predictive component 114 may take data retrieved from model 190 to generate predictive data 168. In some embodiments, predictive component 114 provides predictive data 168 to client device 120, and client device 120 causes a corrective action (e.g., including displaying predictive data 168 for a user) via corrective action component 122 in view of predictive data 168. In some embodiments, corrective action component 122 obtains an indication of data to be included in a corrective action or presentation element. Corrective action component 122 may retrieve the data. Corrective action component 122 may display the data for a user. Retrieving the data, by corrective action component 122, may include retrieving data from data store 140. Retrieving data may include supplying one or more inputs for model 190 and receiving one or more outputs from model 190. Retrieving data may include providing instructions to predictive component 114 or predictive system 110 and receiving input responsive to the instructions. In some embodiments, corrective action component 122 may store data (e.g., store one or more plots, one or more setting parameters, etc.).

In some embodiments, predictive server 112 may store output (e.g., predictive data 168) of the trained model(s) 190 in data store 140 and client device 120 may retrieve the output from data store 140. In some embodiments, corrective action component 122 receives an indication of a corrective action from predictive system 110 and causes the corrective action to be implemented (e.g., causes data to be displayed to a user). Each client device 120 may include an operating system that allows users to one or more of generate, view, or edit data. Data that may be viewed or manipulated by a user may include indications associated with manufacturing equipment 124. Data that may be viewed or manipulated by a user may include corrective actions associated with manufacturing equipment 124.

In some embodiments, metrology data 160 corresponds to historical property data of products and predictive data 168 is associated with predicted property data. For example, metrology data 160 may correspond to products produced using manufacturing parameters associated with historical sensor data and historical manufacturing parameters. Further, predictive data 168 may be associated with products to be produced in conditions recorded by current sensor data or related to current manufacturing parameters. In some embodiments, predictive data 168 is predicted metrology data (e.g., virtual metrology data) of the products to be produced or that have been produced according to conditions recorded as current sensor data and/or current manufacturing parameters. In some embodiments, predictive data 168 is or includes an indication of abnormalities (e.g., abnormal products, product defects, abnormal components, abnormal manufacturing equipment, abnormal energy usage, etc.) and/or one or more causes of the abnormalities. In some embodiments, predictive data 168 includes an indication of change over time or drift in some component of manufacturing equipment 124, sensors 126, metrology equipment 128, and the like. In some embodiments, predictive data 168 includes an indication of an end of life of a component of manufacturing equipment 124, sensors 126, metrology equipment 128, or the like.

In some embodiments, one or more outputs of model 190 may be provided to presentation component 115. Presentation component 115 may generate an indication of model learning, model input/output mappings and/or associations, or the like. Output of presentation component 115 (e.g., plots, GUI elements, etc.) may be similar to those discussed in connection with FIGS. 3-4. In some embodiments, presentation component 115 may generate one or more plots for presentation of relationships between input conditions and target outputs. For example, presentation component 115 may generate one or more plots that present predictions of substrate lithography performance metrics based on dose and focus processing parameters. Presentation component 115 may generate plots for presentation to a user. Presentation component 115 may generate plots based on predictive data 168 that may be used in performing a corrective action, such as designing or updating a process recipe.

In some embodiments, a model (e.g., model 190) may generate a single output from a set of inputs. In some embodiments, a model (e.g., model 190) may generate a plurality of outputs from a set of inputs. In some embodiments, a model may generate several outputs directed at a single feature from a set of inputs (e.g., thickness measurements from a number of locations of a substrate, etc.). In some embodiments, a model may generate several outputs directed at multiple features from a set of inputs (e.g., thickness and resistivity measurements from a number of locations of a substrate).

In some embodiments, presentation component 115 may update a plot based on user selection, e.g., of settings, of parameters, of baseline input conditions, or the like. A user may be able to navigate the input and/or output space via a GUI, e.g., associated with client device 120. Operation of a GUI, operation of presentation component 115, example plots, and the like, are discussed in more detail in connection with FIGS. 3-5.

Designing substrate processing procedures (e.g., substrate process recipes) may be an expensive process. Designing substrate processing procedures may include a large expenditure of time (in particular, time of subject matter experts). Designing substrate processing procedures may include processing a large number of test substrates. Designing substrate processing procedures may include an expenditure of substrate material for test substrates. Designing substrate processing procedures may include an expenditure of gases for test substrates. Designing substrate processing procedures may include expenditures related to disposing of test substrates. Designing substrate processing procedures may include expenditures of energy in producing test substrates. Designing substrate processing procedures may cause an environmental impact in association with producing test substrates. By inputting data associated with substrate manufacturing into a model system, receiving predictive data as output, and displaying plots of the predictive data for a user, substrate processing procedures may be designed more efficiently, offsetting some of the disadvantages associated with designing substrate processing procedures.

Performing manufacturing processes that result in defective products can be costly in time, energy, products, components, manufacturing equipment 124, the cost of identifying the defects and discarding the defective product, etc. By inputting sensor data 142 (e.g., measurements of conditions in a processing chamber) and/or manufacturing parameters 150 (e.g., processing recipe parameters) into model 190 (e.g., a machine learning model), receiving output of predictive data 168, and performing a corrective action based on predictive data 168, system 100 can have the technical advantage of avoiding the cost of producing, identifying, and discarding defective products.

Performing manufacturing processes that result in failure of the components of the manufacturing equipment 124 can be costly in downtime, damage to products, damage to equipment, express ordering replacement components, etc. By inputting sensor data 142 and/or manufacturing parameters 150 to model 190 (e.g., a machine learning model, a physics-based model, a statistical model, etc.) and receiving output of predictive data 168, and performing corrective actions (e.g., predicted operational maintenance, such as replacement, processing, cleaning, etc. of components) based on the predictive data 168, system 100 can have the technical advantage of avoiding the cost of one or more of unexpected component failure, unscheduled downtime, productivity loss, unexpected equipment failure, product scrap, or the like. Monitoring the performance over time of components, e.g. manufacturing equipment 124, sensors 126, metrology equipment 128, and the like, may provide indications of degrading components. Monitoring the performance of a component (e.g., a substrate support) over time may extend the component's operational lifetime, for instance if, after a standard replacement interval passes, measurements indicative that the component may still perform well (e.g., performance above a threshold) for a time (e.g., until the next planned maintenance event).

Manufacturing parameters may be suboptimal for producing products which may have costly results of increased resource (e.g., energy, coolant, gases, etc.) consumption, increased amount of time to produce the products, increased component failure, increased proportion of defective products produced, etc. By inputting the data into a trained model 190 (e.g., a statistical model, a machine learning model, a physics-based model, etc.), receiving an output of predictive data 168, and performing (e.g., based on predictive data 168) a corrective action of updating manufacturing parameters (e.g., setting optimal manufacturing parameters), system 100 can have the technical advantage of using optimal manufacturing parameters (e.g., hardware parameters, process parameters, optimal design) to avoid costly results of suboptimal manufacturing parameters.

Corrective action may be associated with one or more of Computational Process Control (CPC), Statistical Process Control (SPC) (e.g., SPC on electronic components to determine process in control, SPC to predict useful lifespan of components, SPC to compare to a graph of 3-sigma, etc.), Advanced Process Control (APC), model-based process control, preventative operative maintenance, design optimization, updating of manufacturing parameters, updating manufacturing recipes, feedback control, machine learning modification, or the like.

In some embodiments, the corrective action includes providing an alert (e.g., an alarm to stop or not perform the manufacturing process if predictive data 168 indicates a predicted abnormality, such as an abnormality of the product, a component, or manufacturing equipment 124). In some embodiments, the corrective action includes providing feedback control (e.g., modifying a manufacturing parameter responsive to the predictive data 168 indicating an abnormality). In some embodiments, the corrective action includes updating a processing recipe (e.g., modifying one or more manufacturing parameters based on the predictive data 168). In some embodiments, performance of the corrective action includes causing updates to one or more manufacturing parameters. In some embodiments, performance of the corrective action includes causing updates to one or more calibration tables and/or equipment constants (e.g., a set point provided to a component may be adjusted by a value across a number of process recipes, for example voltage applied to a heater may be increased by 3% for all processes using the heater).

Manufacturing parameters may include hardware parameters (e.g., a history of replacing components, an indication that the manufacturing system is using certain components, an indication of updates to processing such as replacing a processing chip or updating firmware, etc.) and/or process parameters (e.g., temperature, pressure, flow, rate, electrical current, voltage, gas flow, lift speed, etc.). The corrective action may include designing and/or updating a process recipe in view of the predictive data.

In some embodiments, the corrective action includes causing design optimization (e.g., updating manufacturing parameters, manufacturing processes, manufacturing equipment 124, etc. for an optimized product). In some embodiments, the corrective action includes a updating a recipe (e.g., manufacturing equipment 124 to be in an idle mode, a sleep mode, a warm-up mode, etc.). In some embodiments, a corrective action (e.g., recommended by model 190, performed by client device 120, performed by presentation component 115, or the like) may include providing an alert to a user (e.g., preparing data for presentation to a user).

Predictive server 112 and server machine 170 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Predictive server 112 may include predictive component 114. Predictive component 114 may be used to produce predictive data 168. In some embodiments, predictive component 114 may receive sensor data, and/or manufacturing parameters (e.g., receive from the client device 120, retrieve from the data store 140) and generate output for performing corrective action associated with manufacturing equipment 124 based on the input data.

Manufacturing equipment 124 may be associated with one or more machine leaning models, physics-based models, statistical models, and so on, e.g., model 190. Machine learning models and other models associated with manufacturing equipment 124 may perform many tasks, including process control, classification, performance predictions, etc. Model 190 may be trained using data associated with manufacturing equipment 124 or products processed by manufacturing equipment 124, e.g., sensor data 142 (e.g., collected by sensors 126), manufacturing parameters 150 (e.g., associated with process control of manufacturing equipment 124), metrology data 160 (e.g., generated by metrology equipment 128), etc.

In some embodiments, predictive component 114 may use one or more models 190 to determine the output for performing the corrective action based on current data. Model 190 may be a single model, an ensemble model, or a collection of models used to process data. Model 190 may include one or more physics-based digital twin models, supervised machine learning models, unsupervised machine learning models, semi-supervised machine learning models, statistical models, etc.

In some embodiments, data indicative of properties of a substrate to be produced using a manufacturing system (e.g., predictive data) is provided to a model such as a trained machine learning model (e.g., model 190). The model may be trained to output data indicative of a corrective action to produce a substrate with different characteristics. In some embodiments, data indicative of predictive properties of a substrate produced using manufacturing equipment 124, and metrology data of a substrate produced with that substrate support are provided as input to a model (e.g., model 190). The model may predict underlying causes for differences between predicted and measured data (e.g., manufacturing fault, component aging or drift, etc.). In some embodiments, model 190 may be updated responsive to changes in a manufacturing system, such as aging or drift of components of the system.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store sensor data 142, manufacturing parameters 150, metrology data 160, and predictive data 168. Sensor data may include sensor data time traces over the duration of manufacturing processes, associations of data with physical sensors, pre-processed data, such as averages and composite data, and data indicative of sensor performance over time (i.e., many manufacturing processes). Manufacturing parameters 150 and metrology data 160 may contain similar features. Predictive data 168 may include data output by predictive system 110. Metrology data 160 may be utilized for training model 190, may include predicted metrology data output by model 190, etc. Metrology data 160 may be metrology data of produced substrates, as well as sensor data, manufacturing data, and model data corresponding to those products. Metrology data 160 may be leveraged to design processes for making further substrates. Predictive data 168 may include predictions of metrology data resulting from operation of a substrate support, predictions of component drift, aging, or failure, predictions of component lifetimes, etc.

In some embodiments, predictive system 110 further includes server machine 170 and server machine 180. Server machine 170 may perform one or more operations described in connection with controlling manufacturing equipment 124, sensors 126, and/or metrology equipment 128. Server machine 170 may perform one or more operations described as being performed by client device 120, in some embodiments.

Execution of model 190 may include performing a series of operations to generate predictive data 168. Model 190 may be executed by client device 120, one or more components of predictive system 110, etc. Operations of model 190 may include determining fit functions, fitting data, generating plots of data, displaying plots, etc. Model 190 may refer to a machine learning model, which may be the model artifact that is created by the training engine 182 using a training set that includes data inputs and corresponding target outputs (correct answers for respective training inputs). Model 190 may additionally or alternatively refer to a statistical model or physics-based model. Patterns in the data sets can be found that map the data input to the target output (the correct answer), and the model 190 is provided mappings that captures these patterns. In some embodiments, model 190 may predict properties of substrates associated with particular processing conditions.

Predictive component 114 may provide input data to a trained model 190 and may run the trained model 190 on the input to obtain one or more outputs. Predictive component 114 may be capable of determining (e.g., extracting) predictive data 168 from the output of the model 190 and may determine (e.g., extract) confidence data from the output that indicates a level of confidence that the predictive data 168 is an accurate predictor of a process associated with the input data for products produced or to be produced, or an accurate predictor of components of manufacturing equipment 124. Predictive component 114 may be capable of determining predictive data 168, including predictions on finished substrate properties and predictions of effective lifetimes of components of manufacturing equipment 124, sensors 126, or metrology equipment 128 based on the output of model 190. Predictive component 114 or corrective action component 122 may use the confidence data to decide whether to cause a corrective action associated with the manufacturing equipment 124 based on predictive data 168. Presentation component 115 may utilize confidence data, e.g., in visually presenting some regions of output space of a model as uncertain (e.g., by showing data in a different color, shape, shade, size, level of transparency, or the like to indicate mode confidence).

The confidence data may include or indicate a level of confidence. As an example, predictive data 168 may indicate the properties of a finished wafer given a set of manufacturing inputs, including the use of manufacturing equipment 124. The confidence data may indicate that the predictive data 168 is an accurate prediction for products associated with at least a portion of the input data. In one example, the level of confidence is a real number between 0 and 1 inclusive, where 0 indicates no confidence that the predictive data 168 is an accurate prediction for products processed according to input data and 1 indicates absolute confidence that the predictive data 168 accurately predicts properties of products processed according to input data. Responsive to the confidence data indicating a level of confidence below a threshold level for a predetermined number of instances (e.g., percentage of instances, frequency of instances, total number of instances, etc.) the predictive component 114 may cause the model 190 to be re-trained (e.g., based on current sensor data, current manufacturing parameters, etc.).

In some embodiments, the functions of client device 120, predictive server 112, and server machine 170 may be provided by a fewer number of machines. For example, in some embodiments server machine 170 and predictive server 112 may be integrated into a single machine, while in some other embodiments, server machine 170, client device 120, and predictive server 112 may be integrated into a single machine. In some embodiments, client device 120 and predictive server 112 may be integrated into a single machine.

In general, functions described in one embodiment as being performed by client device 120, predictive server 112, and server machine 170 can also be performed on predictive server 112 in other embodiments, if appropriate. In addition, the functionality attributed to a particular component can be performed by different or multiple components operating together. For example, in some embodiments, predictive server 112 may determine the corrective action based on the predictive data 168. In another example, client device 120 may determine the predictive data 168 based on output from model 190 (e.g., a statistical fit model).

In addition, the functions of a particular component can be performed by different or multiple components operating together. One or more of predictive server 112, server machine 170, or client device 120 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Figure 2:
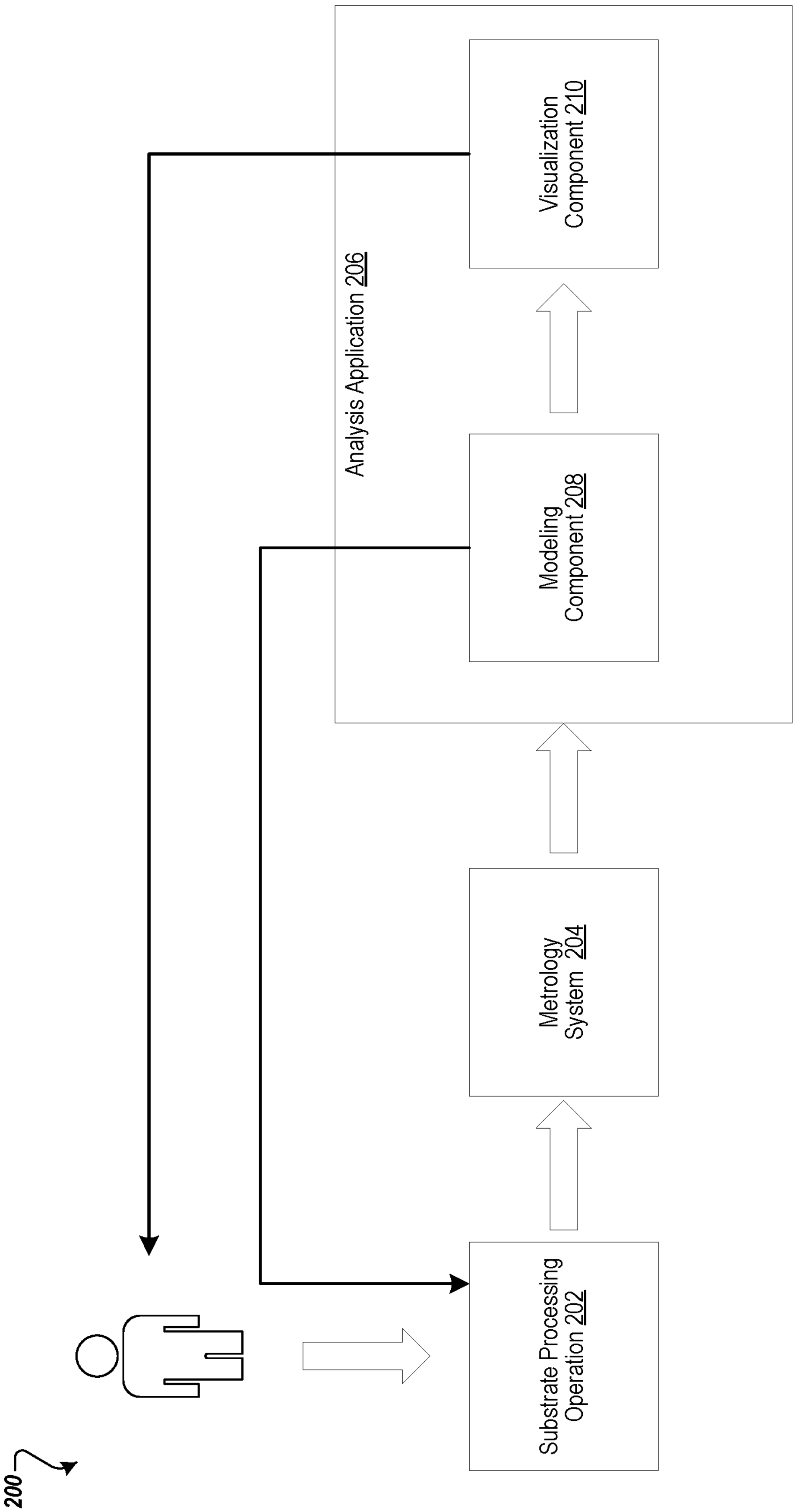
FIG. 2 is a block diagram of an example flow for utilizing an analysis application for performance of a corrective action, according to some embodiments.

FIG. 2 is a block diagram of an example flow 200 for utilizing an analysis application for performance of a corrective action, according to some embodiments. Initially, one or more substrate processing operations 202 are performed. The substrate processing operations 202 may be part of a substrate processing procedure, e.g., the substrate processed may be processed according to a process recipe. The substrate processing operations 202 may be a set of test operations, e.g., for process recipe design, process recipe updates, process recipe refinement, or the like. The substrate processing operations 202 may be a procedure for determining substrate reaction to one or more sets of processing conditions. For example, substrate processing operations 202 may include testing a series of different areas of a substrate with different conditions, such as different dose and/or focus conditions for a lithography process. The substrate processing operations 202 may have been designed, implemented, etc., by one or more users. The substrate processing operations 202 may have been designed, implemented, etc., by one or more subject matter experts, e.g., process design experts.

Upon completion of substrate processing operations 202, one or more substrates may be provided to metrology system 204. Metrology system 204 may make one or more measurements of properties of the substrates. Metrology system 204 may make measurements of one or more properties indicative of predicted performance of the substrate. Metrology system 204 may generate metrology data indicative of properties of a substrate. Metrology system 204 may make geometric measurements, such as film thickness, critical dimension, etc. Metrology system 204 may make material property measurements, such as index of refraction, extinction coefficient, electrical properties, etc. Metrology system 204 may make patterning measurements, such as line edge roughness, line width roughness, etc. Metrology system 204 may generate data indicative of a likelihood of a substrate developing one or more types of defects based on processing conditions. Data indicative of a likelihood of developing a defect may be based on portion of defects developed in a number of substrates processed. Types of defects of interest may include bridges, breaks, or other types of relevant defects.

Data generated by metrology system 204 may be provided to an analysis application 206. Data generated by metrology system 204 may include indications of substrate properties and/or performance. Data provided to analysis application 206 may include indications of processing conditions, e.g., sensor data, manufacturing parameter data, etc. Providing of data to analysis application 206 may be performed by a user, e.g., by providing data via a data storage device, a network connection, or the like. Providing of data to analysis application 206 may be guided by a user, e.g., a graphical user interface (GUI) of analysis application 206 may be utilized by a user to select data for analysis, to browse/import data for analysis, etc.

Analysis application may include modeling component 208 and visualization component 210. Modeling component 208 may generate predictive data based on data received by analysis application 206. Visualization component 210 may generate plots or other visualizations for display to a user. Output of modeling component 208 may be used to adjust or improve substrate processing operations 202. Output of visualization component 210 may be provided to one or more users. Users may utilize information presented by visualization component 210 in improving substrate processing operations 202.

Modeling component 208 may perform one or more analysis/modeling operations for generating predictive data. Operations of modeling component 208 may include performing one or more fits. Operations of modeling component 208 may include generating one or more decision boundaries, e.g., related to a likelihood of achieving a target outcome. Operations of modeling component 208 may include identifying regions of input parameter space related to one or more values of substrate performance (e.g., substrate properties, substrate defect likelihood, etc.).

Modeling component 208 may perform one or more analysis techniques relating inputs (e.g., process conditions) to outputs (e.g., substrate performance). Modeling component 208 may perform any of a variety of fitting and/or analysis techniques. For example, modeling component 208 related to lithography systems may perform Bossung analysis, which relates a critical dimension to input focus and exposure or dose. Modeling component 208 may fit data to a surface. For example, modeling component 208 may fit an output property such as critical dimension to a two dimensional input space, such as dose and focus. Modeling component 208 may perform a quadratic fit with a cross term of a target substrate property to two or more input properties, such as dose and focus. In some embodiments, modeling component 208 may perform a fit that generates a surface, and may generate indications of multiple cross sections of the surface.

Modeling component 208 may generate an indication of processing conditions that result in a substrate that meets one or more target performance metrics. Modeling component 208 may generate one or more decision boundaries (e.g., based on a surface fit) related to a likelihood of a substrate meeting target performance metrics. Modeling component 208 may generate one or more decision boundaries based on values of a fit. Modeling component 208 may generate one or more decision boundaries based on further properties of the fit. For example, a gradient of a fit surface may be used in generating decision boundaries. Modeling component 208 may prioritize regions of process space where small variations in input conditions don't produce dramatic changes in output properties, e.g., regions of process space with consistent results.

Modeling component 208 may generate one or more indications of a likelihood of developing substrate defects. Modeling component 208 may generate indications of general defects, indications of one or more types of defects, etc. Modeling component 208 may generate boundaries separating regions of process space based on a likelihood of a substrate developing a defect.

Visualization component 210 may generate one or more visualizations based on data output by modeling component 208, such as plots, graphs, or the like. Visualization component 210 may generate visualizations based on Bossung or similar analyses. For example, visualization component 210 may generate one or more plots including a curve representing a substrate performance metric value plotted against a processing input parameter. Visualization component 210 may generate a plot including a series of curves that represent critical dimension, plotted against focus. Each of the series of curves may correspond to a given value of dose/exposure. Visualization component 210 may generate a series of curves for other input and/or output parameters, e.g., a series of line edge roughness curves as functions of focus, each curve associated with a particular dose; a series of critical dimension curves as a function of dose, each curve associated with a different focus, etc. Visualization component 210 may generate visualizations that express information extracted from analysis that is used to generate such plots, such as plotting a substrate output value found at a minimum of each of a series of curves as a function of another attribute associated with each curve, e.g., plotting critical dimension at the minimum of a series of curves as a function of the dose value associated with the curves. Visualization component 210 may generate various visualizations related to summarizing incoming data, such as visualizations related to statistical metrics (e.g., representing means, standard deviations, quartiles, etc.) of input data in process parameter and/or substrate metrology space.

Visualization component 210 may generate visualizations related to multi-dimensional fitting. Visualization component 210 may generate one or more visualizations of surface fits. For example, a fit relating an output parameter to two input parameters may be represented by a surface. A fit relating critical dimension, line roughness, or another substrate performance metric to focus and dose may be represented as a surface. In some embodiments, visualization component 210 may generate one or more visualizations related to sub-sets of a fit. A lower-dimensional cross section or projection of a higher dimensional fit may be displayed, for example. In some embodiments, a series of cross sections of a fit surface may be displayed. For example, in a dose/focus fit of a substrate performance metric, cross sections in the plane of one independent variable at various values may be displayed instead of or along with the surface view. Visualizations representing the reliability of fits may be displayed, e.g., visualizations showing variance or uncertainty as a function of an input variable.

Visualization component 210 may generate one or more visualizations of process maps. Process maps may provide a picture of process space. Process maps may provide an indication of a value of a substrate performance output (e.g., critical dimension, line edge roughness, defect likelihood, etc.) based on two process inputs (e.g., dose and focus). Process maps may be utilized to visualize multiple substrate performance outputs at the same time. Two visual indicators may be used to display two output conditions based on two process inputs. Two different types or styles of visual indicator may be used to display two substrate performance metrics based on two process inputs. A larger number of substrate performance metrics may be visualized via a process map. In some embodiments, each metric may be displayed using a different type of indicator, two performance metrics may share a type of indicator, etc. For example, a first substrate performance output may be displayed as a color heat map, a second performance output may be displayed as contour lines, a third substrate performance output may be displayed by separating regions of the map by patterning, etc. Multi-output process maps may be used to quickly inspect for regions of process input space with overlapping regions satisfying target output conditions from multiple substrate performance metrics. For example, a process map may show regions of process space with acceptable critical dimension results, that also have a low likelihood of developing a defect. Process maps are discussed further in connection with FIG. 3.

In some embodiments, visualization component 210 may generate one or more visualization elements that are adjustable or customizable. For example, visualization component 210 may provide one or more user interface (UI) elements that may be used by a user to adjust display of a plot, to adjust data shown in a plot, to adjust which plots are displayed, etc. A UI element may be provided that allows a user to adjust a window size of display of a visualization. A UI element may be provided that allows a user to zoom or translate a visualization. A UI element may be provided that allows a user to rotate a plot or a visualization. A UI element may be provided that allows a user to adjust appearance of a visualization, such as a color scheme, data point marker size, color, or shape, etc. A UI element may be provided that allows a user to adjust data displayed, such as adjusting the locations, planes, or directions of cross sections of a surface fit that are displayed.

Figure 3:
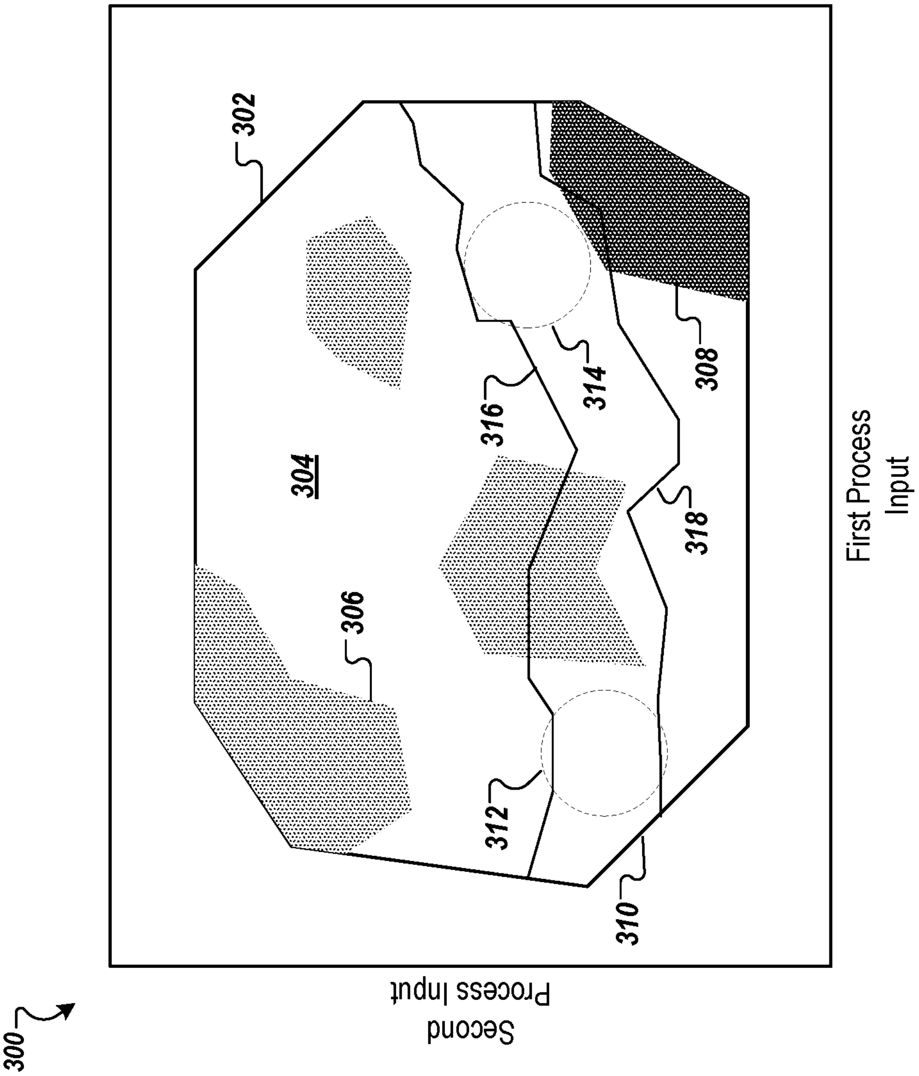
FIG. 3 depicts a visualization of a process map, including regions of process output space as a function of process inputs, according to some embodiments.

FIG. 3 depicts visualization 300 of a process map, including regions of process output space as a function of process inputs, according to some embodiments. Visualization 300 includes an indication of process input space 302. Indication of process input space 302 may be an indication of process input conditions spanned by the substrate data provided to an analysis application. Indication of process input space 302 may be an indication of process input conditions analyzed. Indication of process input space 302 may be an indication of process input space with analysis meeting a threshold confidence level. Indication of process input space 302 may be a target process input space.

Visualization 300 includes multiple indications of regions of process input space. The regions correspond to various property parameters in output space. For example, patterns may indicate values of one output parameter, and lines may bound a region including target values of another parameter. Several types of region indicators may be used in a single visualization. Multiple process outputs may be indicated using the same type of region indicator. Types of indicators for regions of a process map may include patterning regions according to values of a target output corresponding to a region of process input space. Types of indicators for regions of a process map may include coloring regions according to values of a target output. Types of indicators for regions of a process map may include utilizing contour lines to define areas of process input space where a target condition is met, where a boundary between two output values lies, or the like.

In some embodiments, the same type of indicator may be used to represent multiple process output values. For example, a first pair of contour lines may be utilized to indicate a region of process space that satisfies a threshold output condition, and a second pair of contour lines may be utilized to indicate a region of process space that satisfies a second threshold output condition.

In some embodiments, a single visual indicator may be used to represent regions related to multiple process values. For example, a first pattern may be used for regions where neither of two output values (e.g., average critical dimension and average line edge roughness) satisfy a threshold condition, a second and third patterns may be used when one or the two output values satisfy the threshold condition, and a fourth pattern may be used when both of the output values satisfy the respective threshold conditions.

In some embodiments, regions of a process map may be marked in areas of input process space corresponding to one or more threshold values of a process output (e.g., value of a metrology measurement of a substrate). In some embodiments, regions of a process map are marked with an indicator corresponding to a predicted likelihood of developing a defect at the corresponding process conditions. Different types of visual indicators may be utilized to enable efficient and/or accurate visual assessment of multiple process outputs at a given set of process inputs. In some embodiments, patterned or colored regions may indicate a likelihood of developing a defect in a substrate under the associated process conditions, and lines may bound a region that meets target property thresholds, such as target critical dimension, line-edge roughness values, line-width roughness values, etc.

Visualization 300 indicates a first range of values of a first process output with an unpatterned region 304. Unpatterned region 304 may indicate a range of values of the first process output that satisfy one or more threshold conditions. Unpatterned region 304 may combine multiple process outputs, e.g., be associated with regions of process space that result in substrates that meet a first and second output threshold at least a threshold portion of attempts. Unpatterned region 304 may indicate a low likelihood of a substrate developing a defect, a defect of a target defect type, etc. Unpatterned region 304 may instead be related to a target process output value, a target process fit slope, a target certainty, or the like. Patterned regions 306 may indicate values of the process output that satisfy a different threshold condition Patterned regions 306 may indicate regions of process input space correlated to defect likelihood exceeding a target threshold, substrate performance parameters outside a target threshold range of values, substrate performance parameters outside target threshold values above a threshold portion of attempted substrate processing procedures, etc. Patterned region 308 may signify one or more regions of process input space corresponding to process output values even further removed from a target, outside a second threshold range of values, etc.

Target region 310 may indicate an acceptable range of some process output. The process output may be a substrate performance metric, such as critical dimension, one or more line roughness qualities, other material or geometric properties, etc. Boundaries of target region 310 (e.g., first region boundary 316 and second region boundary 318) may indicate a region of process input space that corresponds to process output vales that are within a threshold interval of a target value, within a threshold confidence of the target value, within a threshold likeliness of generating a substrate with property values at the target value, etc.

Process input selections 312 and 314 indicate potential areas of process input space that may be selected by a user for a process operation. Process parameters within these selections may have a high likelihood of satisfying target process output conditions. Process input selections 312 and 314 may represent regions of process input space that are likely to produce substrates that satisfy target conditions described by target region 310 and target conditions described by unpatterned region 304. Process input selections 312 and 314 may indicate regions of process input space that are likely to generate substrates that satisfy both output conditions associated with visualization 300. Further visualizations may indicate a different combination of process outputs, process inputs, etc. A visualization may indicate more than two process outputs. For example, additional region boundaries may highlight additional target regions corresponding to additional process outputs, colored regions may correspond to values of additional process outputs, etc.

In some embodiments, one or more user interface (UI) elements may be provided by an analysis application for adjusting presentation of visualizations. Presentation of process maps may be adjusted by a user by utilizing UI elements provided by the analysis application. Plots may be zoomed, translated, rotated, etc. Data displayed may be adjusted, e.g., variables of the process input space and/or process output space may be selected. Display of data may be adjusted, e.g., switching between types of indicators such as color maps or patterned regions, selecting details such as colors or patterns used, selecting values or ranges for contour lines or region boundaries, etc.

Figure 4:
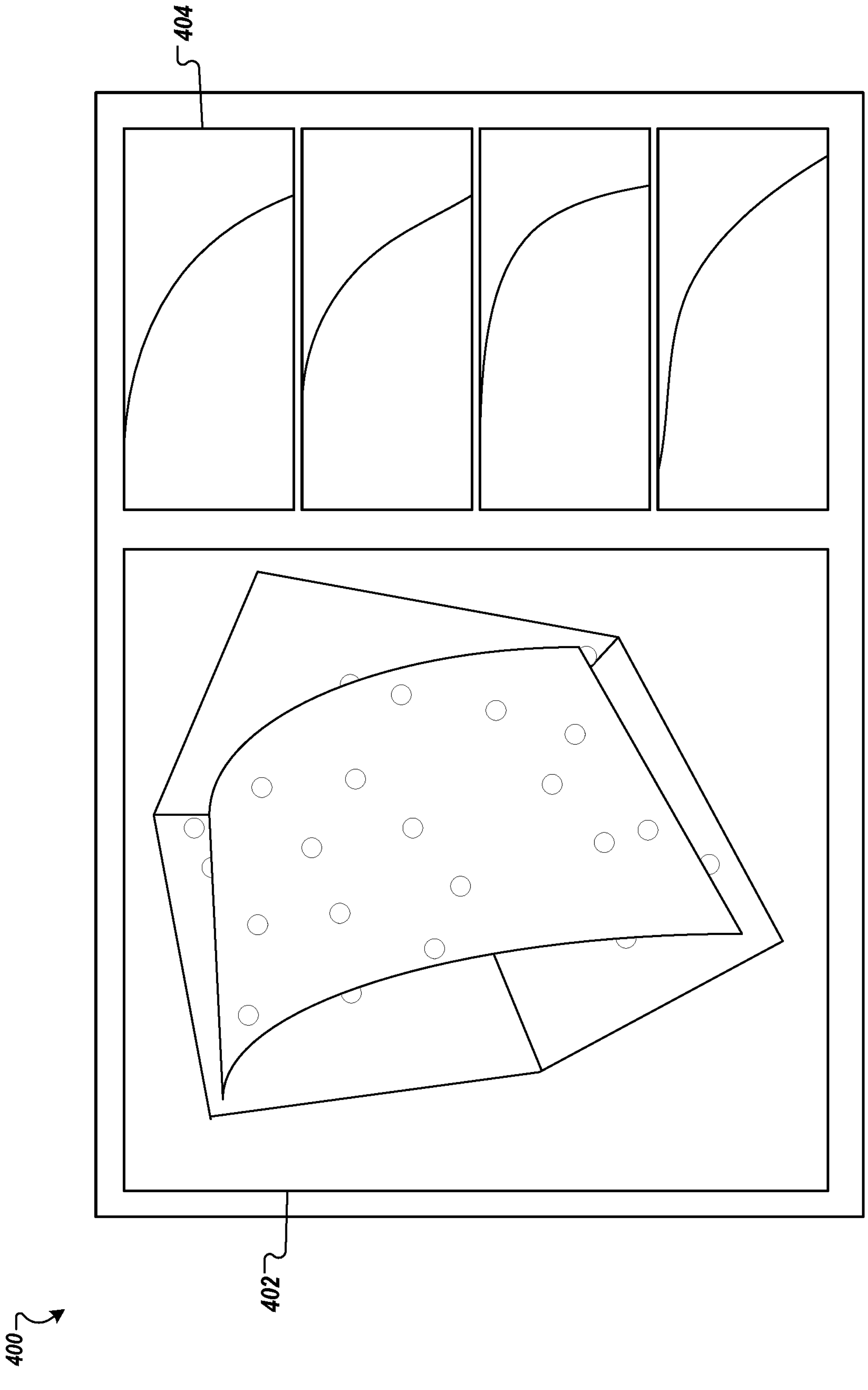
FIG. 4 depicts an example visualization including process output data in two dimensions of process input space, with a fit surface, according to some embodiments.

FIG. 4 depicts an example visualization 400 including process output data in two dimensions of process input space, with a fit surface, according to some embodiments. One or more outputs of interest (e.g., substrate properties) may be measured and correlated to process inputs (e.g., sensor data indicative of substrate processing conditions, manufacturing parameters, etc.).

Visualization 400 includes surface view 402. Surface view 402 depicts a three-dimensional picture of substrate data and a fit surface associated with the data. One or more items included in surface view 402 may not be displayed, be hidden, be transparent, etc., according to user preference or system settings.

Visualization 400 may depict a relationship between a process output (e.g., a substrate performance metric, a substrate metrology metric, etc.) and two process inputs (e.g., process conditions). Visualization 400 may depict a relationship between lithography process inputs and output. Visualization 400 may depict a relationship between a target process output and dose and focus inputs. Visualization 400 may depict a relationship between dose and focus inputs and critical dimension, line edge roughness, line width roughness, or another process output value. Visualization 400 may enable a user to quickly observe values of an output associated with regions of process input space, slope of an output space corresponding to a region of process input space, etc. In some embodiments, surface view 402 may depict a subset of data associated with a fit. For example, surface view 402 may depict data from a two-dimensional slice of process input space, from a fit that is based on a three-dimensional process input space.

Visualization 400 includes cross sections 404. Each cross section may be associated with a plane intersecting with a fit surface depicted in surface view 402. Each cross section may be associated with a surface of interest different than a plane intersecting with a fit surface of surface view 402. In some embodiments, a set of cross sections may be adjusted, e.g., along with visualization 400, an analysis application may provide a user interface (UI) element for adjusting the locations of cross sections that are displayed in visualization 400. Any plots displayed with visualization 400 may include accompanying statistical data, goodness of fit data, goodness of fit plots, etc.

Any visualizations generated by an analysis application may be adjustable and/or customizable. A visualization component of the analysis application may provide one or more UI elements for a user to adjust display of one or more visualizations. UI elements may be provided enabling a user to rotate, translate, and/or zoom plots associated with one or more visualizations. For example, a user could adjust a viewing angle or center location of the surface depicted in surface view 402. A UI element may be provided to adjust visual indications of a fit surface, such as adjusting a color map, a transparency, a wire grid visualization, or the like. A UI element may be provided to adjust visual indications of data points associated with a fit, such as adjusting data point representation shape, color, size, opacity, etc. A UI element may be provided to adjust which data is displayed in a visualization. A UI element may be provided to adjust which process inputs are displayed, and/or which process output values are displayed. For example, a UI element including a drop-down menu with possible process outputs (e.g., critical dimension, line edge roughness, line width roughness) may be provided, and a visualization may be updated responsive to a user selection. A UI element may be used to adjust which subset(s) of data available are displayed. For example, a UI element may be provided to enable customization of cross sections displayed of a surface fit. Orientation and location of cross sectioning planes may be customized, shapes of other cross sectioning surfaces may be customized, etc.

Figure 5:
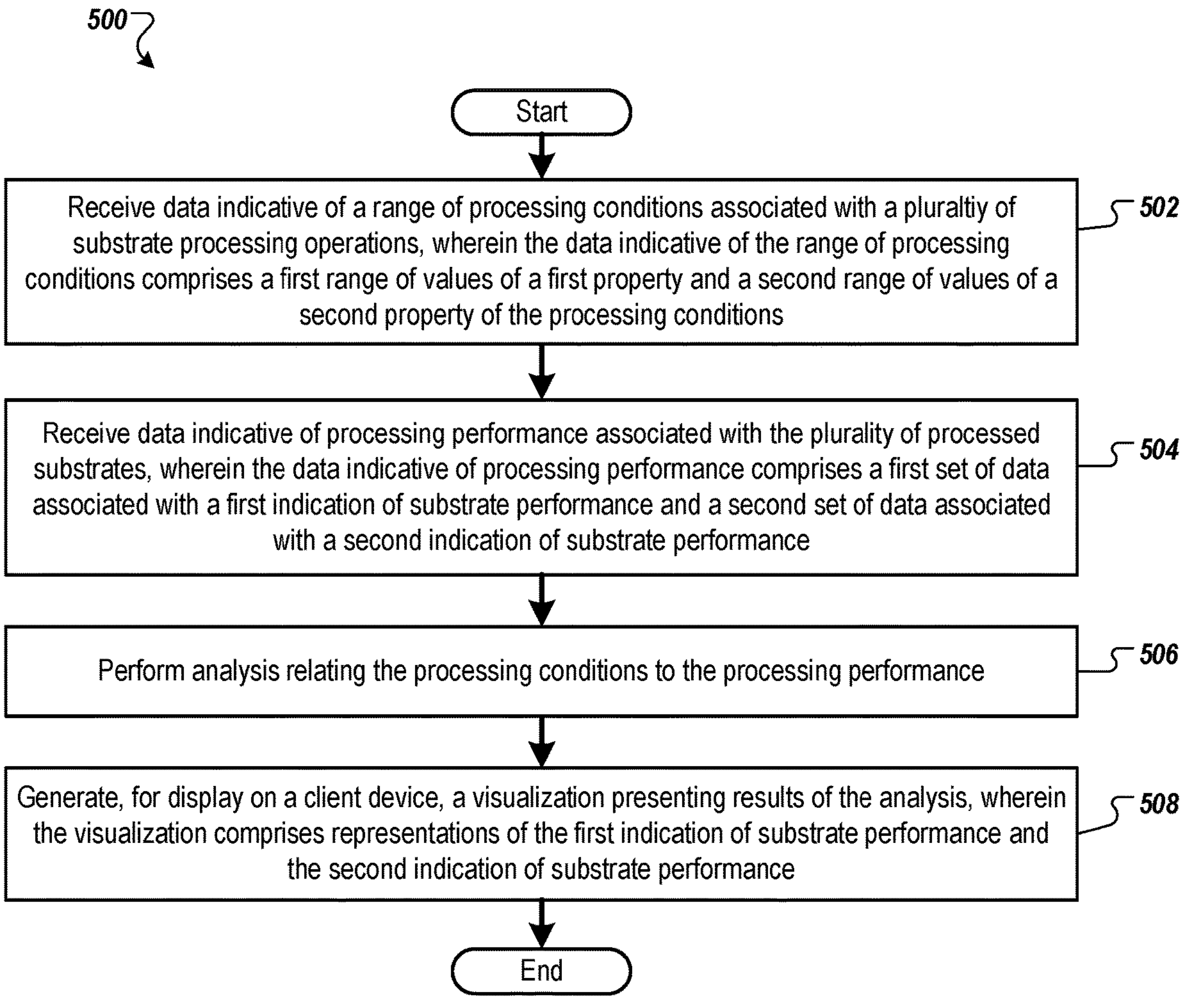
FIG. 5 is a flow chart of a method for generating a visualization related to substrate processing, according to some embodiments.

FIG. 5 is a flow chart of a method 500 for generating a visualization related to substrate processing, according to some embodiments. Method 500 may be performed by processing logic that may include hardware (circuitry, dedicated logic, etc.), software (e.g., instructions run on a processing device), or a combination thereof. In one implementation, some or all the operations of method 500 may be performed by one or more components of system 100 of FIG. 1. In some embodiments, one or more operations of method 500 may be performed by client device 120 of FIG. 1.

At block 502, processing logic receives data indicative of a range of processing conditions associated with a plurality of substrate processing operations. The substrate processing operations may be part of or include substrate manufacturing procedures, substrate processing test procedures, etc. The data indicative of the range of processing conditions includes a first range of values of a first property and as second range of values of a second property of the processing conditions. For example, the data indicative of the range of processing conditions may include data representing a range of dose and focus values. Operations of block 502 may be executed by an analysis application.

In some embodiments, the plurality of substrate processing operations includes a plurality of lithographic process conditions. The first property may be indicative of a dose of exposure of a substrate to lithography radiation. The second property may be an indication of a location of a focus of lithography radiation.

At block 504, processing logic receives data indicative of processing performance associated with the plurality of processed substrates. The data indicative of processing performance comprises a first set of data associated with a first indication of substrate performance and a second set of data associated with a second indication of substrate performance. Operations of block 504 may be executed by the analysis application.

In some embodiments, indications of processing performance may be or include measured property values of the processed substrates. The first indication of substrate performance may be a value of a material or geometric property of the substrate, such as thickness, extinction coefficient, critical dimension, refractive index, etc. The second indication of substrate performance may include a likelihood of a target type of substrate defect corresponding to a combination of processing conditions.

At block 506, processing logic performs analysis relating the processing conditions to the processing performance. Analysis may include fitting the data, fitting cross sections or projections of the data, determining statistical metrics of the data, determining statistical metrics of fits of the data, etc. Operations of block 506 may be executed by the analysis application.

Performing analysis may include performing a first of the first set of data associated with the first indication of substrate performance as a dependent variable to both the first range of values of the first property and the second range of values of the second property. The fit may generate a surface in the space spanned by the first property and the second property. The fit may include at least one cross term between values of the first property and the second property. For example, the fit may be up to polynomials of second degree in both the first and second property, with one term that multiplies values of the first property and values of the second property. Performing analysis may further include determining a first boundary in an input space. The input space comprises the space spanning the values of the first property and the values of the second property. The boundary separates a first region of process space associated with substrate performance that satisfies a threshold condition from a second region of process space associated with substrate performance that does not satisfy the threshold condition.

At block 508, processing logic generates a visualization presenting results of the analysis, wherein the visualization comprises representations of the first indication of substrate performance and the second indication of substrate performance. The visualization may be prepared for display on a client device. Operations of block 508 may be executed by the analysis application. In some embodiments, the visualization presenting results of the analysis may include an interactable UI element for receiving input from a user. The interactable UI element may be utilized by a user to adjust the visualization.

In some embodiments, the visualization may include one or more indications of regions of process space (e.g., input condition space, substrate processing condition space) that satisfy a first defect threshold condition and a second material or geometric property threshold condition. In some embodiments, the second material or geometric property threshold condition includes a target slope or gradient value of the material or geometric property to the data indicative of a range of processing conditions.

Processing logic (e.g., the analysis application) may further perform a corrective action in view of the analysis. The corrective action may include providing an alert to a user. For example, regions of process space that are not predicted to achieve target substrate properties may be marked in the visualization to alert a user. The corrective action may include updating a process recipe in view of the analysis. The corrective action may include scheduling maintenance.

Figure 6:
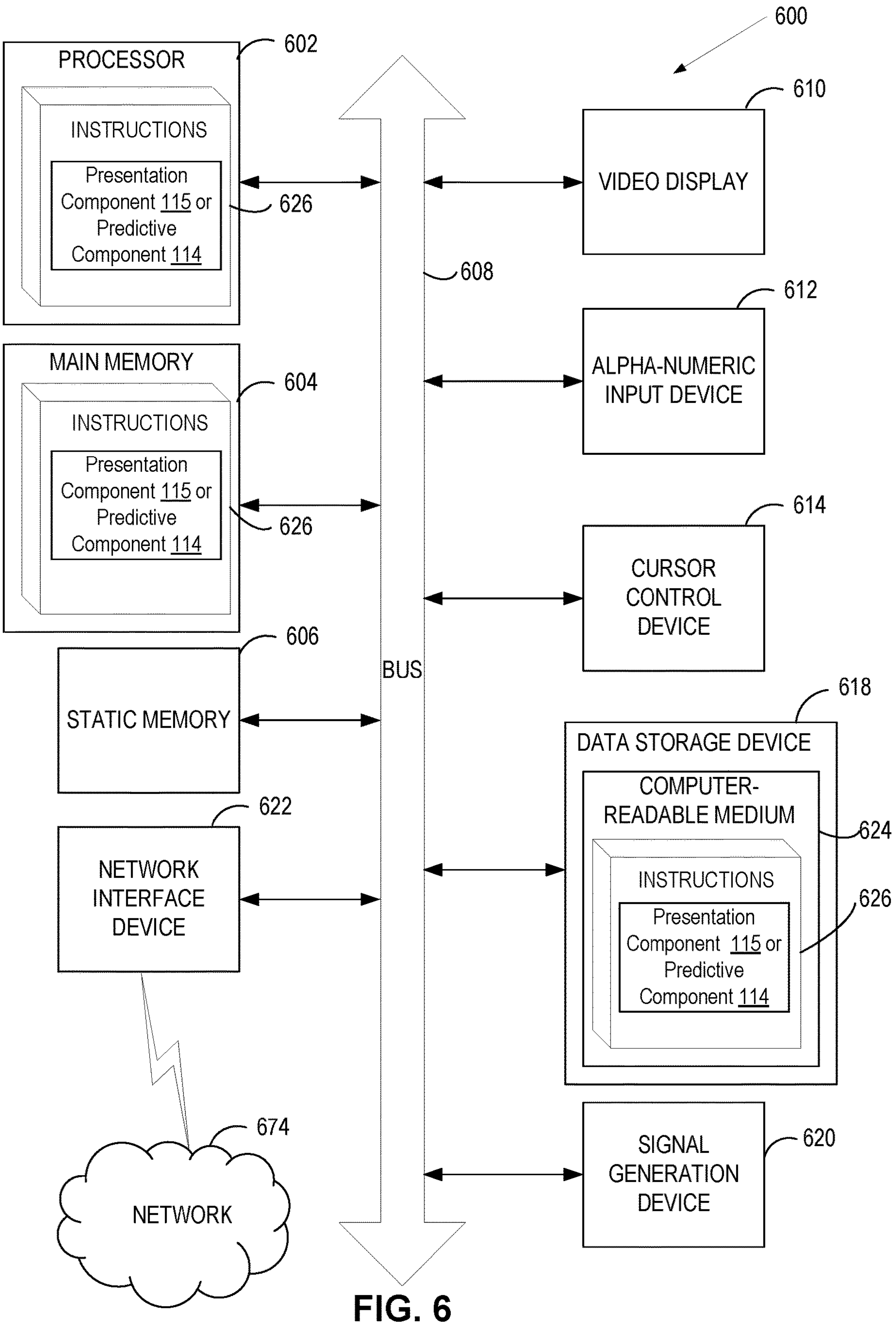
FIG. 6 is a block diagram illustrating a computer system, according to some embodiments.

FIG. 6 is a block diagram illustrating a computer system 600, according to certain embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 618, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some implementations, data storage device 618 may include a non-transitory computer-readable storage medium 624 (e.g., non-transitory machine-readable storage medium) on which may store instructions 626 encoding any one or more of the methods or functions described herein, including instructions encoding components of FIG. 1 (e.g., predictive component 114, presentation component 115, model 190, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," "generating," "preparing," "training," "facilitating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:

receiving, by an application executed by a processing device, data indicative of a range of processing conditions associated with a plurality of substrate processing operations, wherein the data indicative of the range of processing conditions comprises a first range of values of a first property and a second range of values of a second property of the processing conditions;

receiving, by the application, data indicative of processing performance associated with a plurality of processed substrates associated with the plurality of substrate processing operations, wherein the data indicative of processing performance comprises a first set of data associated with a first indication of substrate performance and a second set of data associated with a second indication of substrate performance;

performing analysis relating the processing conditions to the processing performance; and generating, for display on a client device, a visualization presenting results of the analysis, wherein the visualization comprises a two dimensional plot comprising a first axis corresponding to the first property and a second axis corresponding to the second property, and visual representations of the first indication of substrate performance and the second indication of substrate performance plotted with respect to the first axis and the second axis.

2. The method of claim 1, further comprising performing a corrective action in view of the analysis.

3. The method of claim 2, wherein the corrective action comprises one or more of:

updating a process recipe;

providing an alert to a user; or scheduling maintenance.

4. The method of claim 1, wherein performing analysis comprises:

performing a fit of the first set of data associated with the first indication of substrate performance to both the first range of values of the first property and the second range of values of the second property, the fit comprising at least one cross term between values of the first property and values of the second property; and determining a first boundary in an input space comprising values of the first property and values of the second property, wherein the boundary separates a first region of process space associated with substrate performance that satisfies a threshold condition from a second region of process space associated with substrate performance that does not satisfy the threshold condition.

5. The method of claim 1, wherein the plurality of substrate processing operations comprises a plurality of lithography process conditions, and wherein the first property comprises a dose of exposure of a substrate to lithography radiation, and wherein the second property comprises an indication of a location of a focus of lithography radiation.

6. The method of claim 1, wherein the first indication of substrate performance comprises a material or geometric property of a substrate, and wherein the second indication of substrate performance comprises a likelihood of a target type of substrate defect.

7. The method of claim 6, wherein the visualization presenting results of analysis comprises a visualization indicating regions of process space that satisfy a first defect threshold condition and satisfy a second material or geometric property threshold condition.

8. The method of claim 7, wherein the second material or geometric property threshold condition comprises a target slope of a fit of the material or geometric property to the data indicative of a range of processing conditions associated with a plurality of substrate processing procedures.

9. The method of claim 1, wherein the visualization presenting results of the analysis comprises an interactable user interface (UI) element, wherein the interactable UI element may be utilized by a user to adjust the visualization.

10. A non-transitory machine-readable storage medium storing instructions which, when executed, cause a processing device to perform operations comprising:

receiving, by an application executed by a processing device, data indicative of a range of processing conditions associated with a plurality of substrate processing operations, wherein the data indicative of the range of processing conditions comprises a first range of values of a first property and a second range of values of a second property of the processing conditions;

receiving, by the application, data indicative of processing performance associated with the plurality of processed substrates, wherein the data indicative of processing performance comprises a first set of data associated with a first indication of substrate performance and a second set of data associated with a second indication of substrate performance;

performing analysis relating the processing conditions to the processing performance; and generating, for display on a client device, a visualization presenting results of the analysis, wherein the visualization comprises a two dimensional plot comprising a first axis corresponding to the first property and a second axis corresponding to the second property, and visual representations of the first indication of substrate performance and the second indication of substrate performance plotted with respect to the first axis and the second axis.

11. The non-transitory machine-readable storage medium of claim 10, wherein the operations further comprise performing a corrective action in view of the analysis, and wherein the corrective action comprises updating a process recipe.

12. The non-transitory machine-readable storage medium of claim 10, wherein performing analysis comprises:

performing a fit of the first set of data associated with the first indication of substrate performance to both the first range of values of the first property and the second range of values of the second property, the fit comprising at least one cross term between values of the first property and values of the second property; and determining a first boundary in an input space comprising values of the first property and values of the second property, wherein the boundary separates a first region of process space associated with substrate performance that satisfies a threshold condition from a second region of process space associated with substrate performance that does not satisfy the threshold condition.

13. The non-transitory machine-readable storage medium of claim 10, wherein the plurality of substrate processing operations comprise a plurality of lithography process conditions, and wherein the first property comprises a dose of exposure of a substrate to lithography radiation, and wherein the second property comprises an indication of a location of a focus of lithography radiation.

14. The non-transitory machine-readable storage medium of claim 10, wherein the first indication of substrate performance comprises a material or geometric property of a substrate, and wherein the second indication of substrate performance comprises a likelihood of a target type of substrate defect.

15. The non-transitory machine-readable storage medium of claim 14, wherein the visualization presenting results of analysis comprises a visualization indicating regions of process space that satisfy a first defect threshold condition and satisfy a second material or geometric property threshold condition.

16. A system, comprising memory and a processing device coupled to the memory, wherein the processing device is to execute an application, and wherein executing the application comprises:

receiving, by the application executed by the processing device, data indicative of a range of processing conditions associated with a plurality of substrate processing operations, wherein the data indicative of the range of processing conditions comprises a first range of values of a first property and a second range of values of a second property of the processing conditions;

receiving, by the application, data indicative of processing performance associated with the plurality of processed substrates, wherein the data indicative of processing performance comprises a first set of data associated with a first indication of substrate performance and a second set of data associated with a second indication of substrate performance;

performing analysis relating the processing conditions to the processing performance; and generating, for display on a client device, a visualization presenting results of the analysis, wherein the visualization comprises a two dimensional plot comprising a first axis corresponding to the first property and a second axis corresponding to the second property, and visual representations of the first indication of substrate performance and the second indication of substrate performance plotted with respect to the first axis and the second axis.

17. The system of claim 16, wherein executing the application further comprises performing a corrective action in view of the analysis, and wherein the corrective action comprises updating a process recipe.

18. The system of claim 16, wherein performing analysis comprises:

performing a fit of the first set of data associated with the first indication of substrate performance to both the first range of values of the first property and the second range of values of the second property, the fit comprising at least one cross term between values of the first property and values of the second property; and determining a first boundary in an input space comprising values of the first property and values of the second property, wherein the boundary separates a first region of process space associated with substrate performance that satisfies a threshold condition from a second region of process space associated with substrate performance that does not satisfy the threshold condition.

19. The system of claim 16, wherein the plurality of substrate processing operations comprise a plurality of lithography process conditions, and wherein the first property comprises a dose of exposure of a substrate to lithography radiation, and wherein the second property comprises an indication of a location of a focus of lithography radiation.

20. The system of claim 16, wherein the first indication of substrate performance comprises a material or geometric property of a substrate, and wherein the second indication of substrate performance comprises a likelihood of a target type of substrate defect.

* * * * *